United States Patent [19]

Inoue et al.

[11] 4,149,175
[45] Apr. 10, 1979

[54] SOLIDSTATE LIGHT-EMITTING DEVICE

[75] Inventors: Morio Inoue; Kunio Itoh; Kunihiko Asahi, all of Takatsuki City, Japan

[73] Assignee: Matsushita Electric Industrial Co., Ltd., Kadoma City, Japan

[21] Appl. No.: 873,522

[22] Filed: Jan. 30, 1978

Related U.S. Application Data

[63] Continuation of Ser. No. 693,471, Jun. 7, 1976, abandoned.

[30] Foreign Application Priority Data

Jun. 20, 1975 [JP] Japan .................... 50-75902

[51] Int. Cl.$^2$ .................... H01L 33/00; H01S 3/19
[52] U.S. Cl. .................... 357/18; 331/94.5 H; 357/16; 357/17
[58] Field of Search .................... 331/94.5 H; 357/16, 357/17, 18

[56] References Cited

U.S. PATENT DOCUMENTS

| | | | |
|---|---|---|---|
| 3,697,336 | 10/1972 | Lamorte | 357/18 |
| 3,849,790 | 11/1974 | Gottsmann et al. | 331/94.5 H |
| 3,984,262 | 10/1976 | Burnham et al. | 357/18 |

OTHER PUBLICATIONS

Tsukada, "GaAs-Ga$_{1-x}$Al$_x$As Buried-Heterostructure Injection Lasers," *J. of Applied Physics*, vol. 45, No. 11, Nov. 1974, pp. 4899-4906.

Teramoto, "New Structures Boost Semiconductor Laser Performance—At Last A Practical Room-Temp. Visible Laser," JEE Mar. 1975, pp. 32-37.

*Primary Examiner*—Stanley D. Miller, Jr.
*Assistant Examiner*—James W. Davie
*Attorney, Agent, or Firm*—Cushman, Darby & Cushman

[57] ABSTRACT

A mesa region of a stripe geometry is formed by mesa-etching a surface of a GaAs crystal substrate, forming a crystal layer of higher resistivity than the abovementioned crystal substrate so as to fill the abovementioned mesa-etched recesses in a manner that the stripe shaped mesa region is buried in the higher resistivity regions making top faces of the mesa region and the higher resistivity regions flush with each other, then forming, on the abovementioned flush surface, several epitaxial growth regions of semiconductor crystal including a light emitting region, for instance, an active region for lasing, subsequently forming contact isolation region having an opening of the stripe geometry corresponding to and above said mesa region. The current flow in the active region is confined in a narrow stripe region.

11 Claims, 8 Drawing Figures

SOLIDSTATE LIGHT-EMITTING DEVICE

This is a continuation of application Ser. No. 693,471 filed June 7, 1976, now abandoned.

BACKGROUND OF THE INVENTION

This invention relates to a solid-state light-emitting device and particularly concerns a semiconductor laser.

In semiconductor laser devices, as a result of employment of a double heterostructure, lasing at room temperature becomes possible and practical uses of the semiconductor laser device becomes attractive. Double heterostructure semiconductor lasers of an early stage were announced by M. B. Panish et al. in pp 326–327 of Applied Physics Letters, volume 16, number 8 published on Apr. 15, 1970. The device announced in the abovementioned publication has the structure that an n-type $Ga_{1-x}Al_xAe$ region, a p-type GaAs region and a p-type $Ga_{1-x}Al_xAs$ region are formed sequentially on a substrate of n-type GaAs crystal. In the abovementioned device, current is made to flow from the p-type $Ga_{1-x}Al_xAs$ region to the n-type GaAs substrate, and carriers as well as lidht are confined in the GaAs active region, which is a thin region disposed perpendicular to the direction of the current.

Subsequently, as an improved device capable of confining the light in a limited narrow part of an active region, the so-called stripe-type semiconductor laser has been developed. In the stripe-type semiconductor laser, it becomes possible to decrease considerably the threshold current for lasing thereby enabling low current operation. This becomes possible by confining carrier and light within a narrow stripe region. However, even in such a stripe-type laser, dispersion of current in the active region cannot be ignored, and the threshold current is not prominently reduced even when the width of the stripe region is sufficiently narrowed. Moreover, in such a stripe-type laser, on account of the insulation film, of, for instance, $SiO_2$ or $SI_3N_4$ disposed on the surface of the semiconductor wafer except on the surface of the stripe shaped electrode contact, a considerable strain caused by difference of thermal expansion coefficient is produced at the interface between the semiconductor and the insulation film, and the effect of the strain reaches the active region resulting in deterioration of the lasing characteristic, hence shortening the life of the device.

SUMMARY OF THE INVENTION

This invention provides an improved semiconductor laser wherein current is concentrated in a sufficiently small part in its active region, and therefore to provide a semiconductor laser having small threshold current of lasing. A futher object of the present invention is to provide a semiconductor laser wherein substantially no strain of crystal structure occurs.

DETAILED DESCRIPTION OF THE INVENTION

Figure 1:
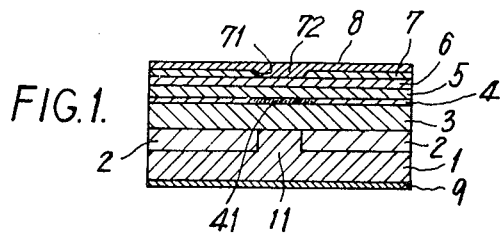
FIG. 1 is a sectional elevation view of a semiconductor laser embodying the present invention.

FIG. 1 shows one example of the semiconductor laser. The substrate 1 of GaAs is mesa-etched so as to retain central part as mesa region 11 of stripe geometry, and a crystal region 2 of higher resistivity than the substrate 1 which crystal region is filled in the mesa-etched recess parts. The higher registivity region 2 is of $Ga_{1-x}Al_xAs$ crystal where $0 \leq x \leq 1$. The mesa region 11 is burried up to its top part in the higher resistivity regions 2 in a manner such that top faces of the mesa region 11 and the higher resistivity regions 2,2 become flush with each other. Then, an n-type $Ga_{0.7}Al_{0.3}As$ region 3, a p-type GaAs active region 4, a p-type $Ga_{0.7}Al_{0.3}As$ region 5 and a p+-type GaAs region 6 are sequentially formed in this order on the abovementioned flush top surfaces of the mesa region 11 and higher resistivity regions 2,2. Furthermore, an n-type $Ga_{1-y}Al_yAs$ ($0 < y \leq 1$) region 7 having an opening 71 of the similar or the same stripe geometry to the mesa region 11 is formed, and a metal electrode 8 which contacts the p+-type GaAs region 6 at the opening 71 is formed on the region 7. The n-type region 7 formed on the p+-type region 6 forms a p-n isolation junction inbetween, and accordingly, the region 7 serves as electrode contact isolation layer. The stripe shaped opening 71 is disposed in a manner to correspond with the top face of the mesa region 11 with the regions 3,4,5 and 6 inbetween. The lasing current is fed from the top metal electrode 8 to the bottom metal electrode 9.

In the laser of the abovementioned structure, both the effective contacting area of the metal electrode 72 and the mesa region 11 of the substrate are of narrow stripe geometry. Accordingly, lines of electric force in the laser device are narrowly concentrated on account of narrow widths of the electrode area 72 and the mesa region 11. Therefore, the current in the active region 4 is well concentrated in a narrow stripe shaped part 41, thereby improving lasing efficiency.

In the abovementioned laser device, the thermal expansion coefficient from the substrate, the active region 4 inclusive, to the isolation region 7 are almost same and the active region 4 is not treated with any undesirable treatments such as mesa-etching and thermal oxidation. Accordingly, there is no fear of any strain reaching the active region 4, and hence deterioration of the characteristic of the laser is eliminated.

FIG. 2 illustrates steps of making the laser device of FIG. 1.

Figure 2A:
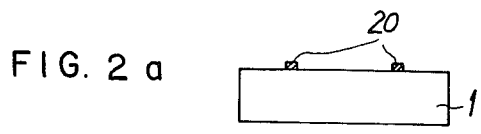
FIG. 2(a) to (f) are sectional elevation views of various steps of the making of the device of FIG. 1.
Figure 2B:
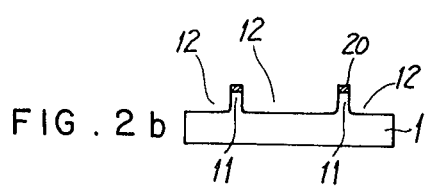
Figure 2C:
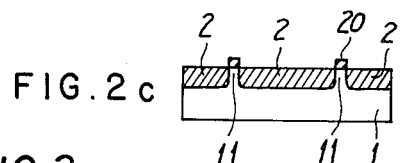

The substrate 1 which is the starting material is (100)-oriented Te-doped n-type GaAs crystal of $2 \times 10^{18} cm^{-3}$ concentration. As shown in FIG. 2(a), $SiO_2$ films of about 5000A thick are formed on the GaAs substrate 1 by a known photochemical method so as to have a pattern of stripes 20 . . . of about 10 μm disposed with 250 μm pitch and in the <110> direction of the substrate crystal. Then, by employing said $SiO_2$ films 20 . . . as an etching mask, the n-type GaAs substrate 1 is mesa-etched with the etchant consisting of sulfuric acid, hydrogen peroxide solution and water in a volume ratio of 8:1:1. The GaAs substrate 1 is etched by the abovementioned etchant at 60° C. for 3 minutes, and then the etching is made to a depth of 6 μm. Thus, the substrate 1 is mesa-etched as shown in FIG. 2(b). Then, as shown in FIG. 2(c), the higher resistivity GaAs crystal regions 2 . . . are filled in the recesses 12 . . . formed by the mesa-etching in a manner that top faces of the filled-in GaAs crystal regions 2 . . . are flush with the top faces of the mesa-regions 11 . . . , and both of the top faces of the regions 2 . . . and 11 . . . are lapped to form a mirror-like flush face. Forming the abovementioned higher resistivity regions is made by a vapor-phase epitaxial growth method by thermal decomposition of mixed gases of trimethygallium (Ga(CH$_3$)$_3$) and arsine(AsH$_3$) by employing the abovementioned SiO$_2$ films as masks. Empirical data show that such high resistivity as $10^4 \Omega cm$ can be obtainable at the temperature of thermal decomposition of 630° C. As the higher resistivity regions 2 . . . , a mixed crystal of GaAlAs can also be used, and in general, the higher resistivity regions 2 . . . can be of Ga$_{1-x}$Al$_x$As where $0 \leq x \leq 1$. In order to decrease strains around the higher resistivity regions 2 . . . , namely strains in the active region 4 originated by the strains in the higher resistivity regions 2 . . . , it is desirable to control the epitaxial growth process so as to make x values with a gradient such that $x=0$ at the bottom part (where the regions 2 . . . contact the substrate 1) and $x=0.3$ at the top face (which contacts the nGa$_{0.7}$Al$_{0.3}$As). The SiO$_2$ films 20 are removed by a known method.

Figure 2D:
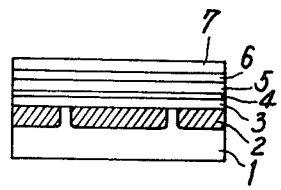
Figure 2E:
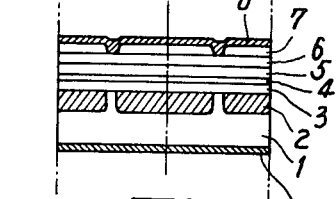
Figure 2F:
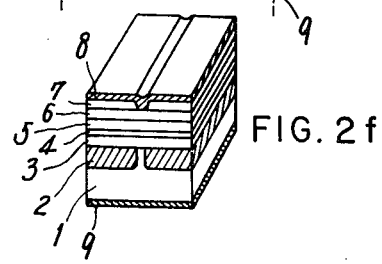

Next, as shown by FIG. 2(d), regions 3 of n-type Ga$_{0.7}$Al$_{0.3}$As, regions 4 of p-type GaAs, regions 5 of p-type Ga$_{0.7}$Al$_{0.3}$As and regions 6 of p$^+$-type GaAs are formed by sequential epitaxial growths on and across the mirror-lapped flush top surface of the substrate 1 and the filled regions 2 . . . . Then the regions 7 of n-type Ga$_{1-y}$Al$_y$As ($0 \leq y \leq 1$) are formed on the region 6. The openings of the strips geometry are formed by known photoetching methods on the region 7 so as to expose the underlying region 6 therefrom. Since the regions 7 and the regions 6 form a heterostructure with each other, the exposed parts of the regions 7 only can be etched away by hot phosphoric acid retaining the underlying regions 6 unharmed. Finally a top metal electrode 8 and the bottom metal electrode 9 are formed to cover the entirety of the top surface and the entirety of the bottom surface, respectively, by means of a known metal vapor deposition method, thereby making a wafer as shown FIG. 2(e). Then, a scribing is made on the wafer and the wafer is cut into individual units as shown in FIG. 2(f) at the cuting lines indicated by the dashed lines in FIG. 2(e).

Figure 3:
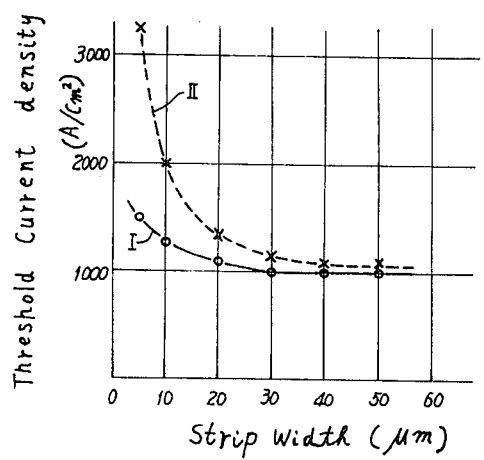
FIG. 3 is a diagram showing lasing characteristic of the examples of the present invention (curve I) as compared with the prior art(curve II).

Fig. 3 shows lasing characteristic curves of the laser embodying the present invention and of the prior art. In FIG. 3, the curve I shows the characteristic of the example of the present invention while curve II shows that of a representative example of conventional stripe type laser using SiO$_2$ films for contact isolation. Threshold current density is very much influenced by thicknesses of the four layers 1,3,4 and 5 which form the double heterostructure, and accordingly, in the examples used for obtaining the curves of FIG. 3, corresponding elements of four layers are selected to be of equal thicknesses, and the threshold current densities are plotted as a function of stripe widths. In the examples of FIG. 3, the thicknesses of the active region 4 are 0.2 μm. As shown in FIG. 3, the semiconductor laser of the present invention has smaller threshold current of lasing in comparison with the conventional stripe type laser, and especially smaller threshold current for smaller stripe widths. Such a fact may be explained that in the conventional structure the current injected from the stripe electrode disperses widely when reaching the active region, and the width of the current at the active region is generally 1.5 to 3 times of the width of the stripe electrode at the stripe width of 10 μm, while in the present invention on account of the stripe-shaped contacting part of the electrode 72 and the stripe-shaped mesa-part 11 disposed on both sides (upper side and lower side) of the active region 4, the current is fairly concentrated in the active region 4.

A further advantage of the present invention is long life with a stable characteristic. As elucidated referring to FIGS. 2(a) to (f), lattice constants of the mesa part 11 and the higher resistivity regions 2 are almost equal to each other, and therefor, there is substantially no strain of crystal structure in these regions. Also the lattice constants of the n-type Ga$_{1-y}$Al$_y$As region 7 and the immediately underlying p$^+$-type GaAs region 6 are made to be almost equal. Accordingly, there is no fear of introducing strains in the active region 4. On account of such ommission of strains, this stable characteristic is assured for a long time. The example of the abovementioned structure and manufacturing method having empirically proved to exhibit a life twice as long in comparison with the conventional examples.

Though the abovementioned example is of a double heterostructure laser, this invention is also applicable to the lasers of single heterostructure, or homo-junction-structure etc., and is also applicable to light emitting diodes.

Features of the present invention are summarized as follows:

(1) The solid state light emitting device comprises on a semiconductor substrate 1 a light emitting portion 3,4,5 and 6 which emits light by injection of a carrier, the substrate 1 comprising narrowed part 11 defined by buried-in higher resistivity semiconductor isolation regions 2,2.

(2) In the device of the abovementioned item(1), the light-emitting part 3,4,5 and 6 and the higher resistivity isolation regions 2,2 are formed from semiconductor crystals of III-V compound, especially of GaAs or GaAlAs.

(3) In the device of the item (1), the light emitting part comprises a heterostructure, and more particularly the heterostructure comprising GaAs-GaAlAs junction.

(4) In the device of the item (1), the light emitting part comprises a double heterostructure and on both sides (namely, on the upper side and on the lower side) of the light emitting part there are formed higher resistivity semiconductor isolation regions 2,2 and semiconductor isolation regions 7,7, respectively, for limiting carries to narrowed paths.

(5) A method for manufacturing the device of the abovementioned items (1) to (4), comprises the following steps:

forming a mesa region 11 on a semiconductor substrate 1 which is a starting material, filling with higher resistivity regions 2,2 in the recesses 12, 12 around the mesa region 11 in a manner that top faces of the mesa region 11 and the filled-in higher resistivity regions 2,2 are flush with each other, and epitaxially growing light-emitting regions 3,4,5 and 6 all the way across and on the flush top faces of the mesa region 11 and the higher resistivity regions, (6) The method of item (5) may further comprise the step of forming semiconductor isolation regions 7,7 which form contact isolation junctions between the underlying region 6, the contact isolation junctions defining the stripe shaped contacting part 72 of the contact electrode 7 in the opening 71 formed inbetween.

(7) The method of item (5) may also include the step wherein the higher resistivity regions are formed by a vapor phase epitaxial growth method.

(8) The method of the items (5) to (7) may also include the features wherein the semiconductor regions comprise GaAs and GaAlAs crystal regions.

What we claim is:

1. A solid state light emitting device comprising on a semiconductor substrate, a light emitting portion which emits light by injection of a carrier, wherein
   said substrate has a stripe-shaped mesa part defined by a surrounding epitaxial layer of higher resistivity isolating regions which layer has a low impurity concentration, the top surfaces of said mesa part and the surrounding higher resistivity isolating regions being level with respect to each other thereby forming a flat surface,
   said light-emitting portion comprising at least two epitaxial growth regions of semiconductor crystal each of different conductivity types, said epitaxial growth regions including, in combination, a light-emitting active region therein, a neighboring region which is disposed contiguous to said light-emitting active region with a p-n junction inbetween, said epitaxial growth regions being formed upon said flat surface to cover said mesa part and said higher resistivity isolating regions,
   an overlying semiconductor layer formed on said light-emitting portion having a p-n junction inbetween, said overlying semiconductor layer having a stripe-shaped opening therein which opening is in alignment with the underlying mesa part, and
   a metal electrode formed in said stripe shaped opening.

2. The device according to claim 1 wherein said higher resistivity semiconductor isolating regions are of a III-V compound.

3. The device according to claim 1 wherein said higher resistivity semiconductor regions are of GaAs or GaAlAs.

4. The device according to claim 1 wherein said light-emitting portion comprises a heterostructure.

5. The device according to claim 4 wherein said heterostructure comprises GaAs-GaAlAs junction.

6. The device according to claim 1 wherein said light-emitting portion comprises a double hetero-structure of GaAlAs-GaAs-GaAlAs and said overlying layer forms semiconductor isolation regions of GaAlAs, said isolation regions being formed by epitaxial growth on said light- emitting portion in a manner such that said isolation regions are disposed above and in the geometry corresponding to said higher resistivity semiconductor isolating regions.

7. A solid state light-emitting device comprising:
   a semiconductor substrate;
   a mesa region formed of said substrate, said mesa region having a stripe-shaped configuration;
   surrounding epitaxial layer regions of GaAlAs which surrounds said mesa and has a lower impurity concentration and higher resistivity than said semiconductor substrate, the top faces of the surrounding higher resistivity isolating regions and the top face of the mesa region being of the same level thereby defining a flat surface,
   a light-emitting portion formed with a plurality of layers which are formed sequentially as epitaxial layers upon said flat surface, said light-emitting region comprising the sequential layers of:
   (i) an n-type GaAlAs layer,
   (ii) a p-type GaAs active layer,
   (iii) a p-type GaAlAs layer, and
   (iv) a p$^+$-type GaAs layer,
   thereby forming a light-emitting double heterostructure of GaAlAs-GaAs-GaAlAs on said flat surface,
   an overlying n-type GaAlAs layer on said p$^+$-type GaAs layer, said overlying n-type GaAlAs layer having a stripe shaped opening which is in alignment with the underlying mesa part; and
   a vapor deposited stripe-type metal electrode formed on the top surface of said light-emitting portion exposed in said opening.

8. The semiconductor light-emitting device according to claim 7 wherein said surrounding epitaxial layer is $Ga_{1-x}Al_xAs$ wherein $\leq x \leq 1$.

9. A solid state light-emitting device comprising the following sequential elements, one upon the other, of:
   a first metal electrode;
   a substrate of GaAs having a central mesa region of striped geometry;
   a layer of $Ga_{1-x}Al_xAs$, where $0 \leq X \leq 1$, surrounding said mesa region and having a resistivity higher than and flush with the top surface of said mesa region;
   a layer of n-type $Ga_{0.7}Al_{0.3}As$;
   a layer of p-type GaAs;
   a layer of p-type $Ga_{0.7}Al_{0.3}As$;
   a layer of p$^+$-type GaAs;
   a layer of n-type $Ga_{1-y}Al_yAs$, where $0 < y \leq 1$, having an opening therein corresponding to and in alignment with said mesa region;
   a second metal electrode contacting said p$^+$-type GaAs layer through said opening in said n-type layer, said second metal electrode forming an electrode contact layer on said p$^+$-type layer,
   whereby a lasing current is supplied from said second metal electrode through the intermediate layers to said first metal electrode, the path of said lasing current being defined by said opening and said mesa region.

10. The semiconductor light-emitting device of claim 9 wherein said layer of $Ga_{1-x}Al_xAs$ is epitaxially deposited on said substrate and around said mesa region by thermal decomposition of trimethylgallium and arsine.

11. The semiconductor light-emitting device of claim 10 wherein said layer of $Ga_{1-x}Al_xAs$ has a resistivity of $10^4$ ohms.

* * * * *